(12) United States Patent
Michaelis et al.

(10) Patent No.: US 6,352,893 B1
(45) Date of Patent: Mar. 5, 2002

(54) LOW TEMPERATURE SELF-ALIGNED COLLAR FORMATION

(75) Inventors: Alexander Michaelis, Wappingers Falls; Stephan Kudelka, Fishkill; Jochen Beintner; Oliver Genz, both of Wappingers Falls, all of NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/324,927

(22) Filed: Jun. 3, 1999

(51) Int. Cl.[7] ............................................ H01L 21/8242
(52) U.S. Cl. ...................... 438/248; 438/391; 438/408; 438/441; 438/770
(58) Field of Search ................................ 438/248, 391, 438/770, 408, 441, 911; 257/301, 516

(56) References Cited

U.S. PATENT DOCUMENTS 5,172,207 A * 12/1992 Nojiri et al. ................. 257/254
5,736,454 A * 4/1998 Hwu et al. ................... 438/585

OTHER PUBLICATIONS

Bardwell, et al., "Growth and characterization of anodic oxides on Si(100) formed in 0.1M hydrochloric acid", Journal of Applied Physics, vol. 79, No. 11, pp. 8761–8769, Jun. 1996.*

* cited by examiner

Primary Examiner—Carl Whitehead, Jr.
Assistant Examiner—Christy Novacek

(57) ABSTRACT

A method for fabricating a semiconductor device, in accordance with the present invention, includes the steps of providing a semiconductor wafer having exposed p-doped silicon regions and placing the wafer in an electrochemical cell such that a solution including electrolytes interacts with the exposed p-doped silicon regions to form an oxide on the exposed p-doped silicon regions when a potential difference is provided between the wafer and the solution.

22 Claims, 5 Drawing Sheets

US 6,352,893 B1

LOW TEMPERATURE SELF-ALIGNED COLLAR FORMATION

BACKGROUND

1. Technical Field

This disclosure relates to semiconductor fabrication and more particularly, to the formation of oxides in semiconductor fabrication.

2. Description of the Related Art

Semiconductor memory devices, such as dynamic random access memories (DRAM's) include capacitors accessed by transistors to store data. Deep trench (DT) capacitors are among the types of capacitors used in DRAM technology. Deep trench capacitors are typically buried within a semiconductor substrate.

Referring to FIG. 1, a silicon substrate 10 is shown having a trench 12 etched therein. Typically, substrate 10 is p-doped. To form a buried plate 14, a lower portion of trench 12 has n-type dopants diffused therein. Buried plate 14 is formed by depositing a dopant rich material into the lower portion of trench 12 and heating the material to drive n-type dopants into substrate 10 to form buried plate 14. Buried plate 14 is separated from an n-type doped region 16 (source or drain) of an access transistor 18 by a p-doped substrate region 20 (p-well). Consequently, there exists an n/p/n junction along a vertical side of trench 12. This n/p/n junction forms a transistor. This undesirable transistor is called a vertical device and can cause a severe leakage of charge from buried plate 14 to access transistor 18 if the undesired transistor is turned on.

To prevent the vertical device from being turned on, a thick dielectric layer is needed on top of the n/p/n junction. This layer is called a trench collar 22 which conventionally includes silicon dioxide. Trench collar 22 determines a threshold voltage $V_t$. Once the applied voltage is larger than $V_t$, the vertical device is turned on and charge flows through the n/p/n junction. The thickness of oxide of collar 22 should be large enough to prevent the vertical device from being turned on during DRAM operation.

Conventionally, voltages in the order of $V_D/2$ are applied to trench 12 where $V_D$ is the power supply voltage (typically about 3 volts). To prevent the vertical device from turning on, an oxide thickness of collar 22 above 25 nm is needed. This collar oxide is typically formed by a chemical vapor deposition (CVD) or a physical vapor deposition (PVD) process with a subsequent collar open etch or with a localized oxidation of silicon (LOCOS) process.

The LOCOS process permits for an easier and cheaper process integration flow when compared to the CVD/PVD processes, and LOCOS is more suitable for small groudrules (i.e., better trench profile). However, the conventional LOCOS collar suffers from the following drawbacks:

1. High temperatures up to 1050 degrees C. are required. This significantly contributes to the thermal budget and can cause stress at the trench device interface resulting in dislocation in the substrate. These dislocations cause variable retention time (VRT) problems for the deep trench capacitor.

2. The LOCOS oxide thickness shows a severe dependence on the silicon crystal orientation of the substrate resulting in a non-uniform collar with thin regions. In these regions, $V_t$ drops significantly causing reliability problems.

3. Collar thickness measurement and control are difficult. Thickness measurements are performed on the surface of monitor wafers. These surfaces have different crystal orientations. Therefore, this thickness does not necessarily relate directly to the collar thickness.

4. To prevent oxidation of the whole trench, a nitride liner is required in the bottom portion of the trench where no oxide is to be formed. The conventional LOCOS process includes a liner which is thicker than 5 nm (typically 5.8 nm) to prevent oxidation of the silicon interface of the substrate. This nitride liner is difficult to remove.

Therefore, a need exists for a method for forming a trench collar which does not suffer from the disadvantages of conventional processes. A further need exists for a self-aligning trench collar which can be formed without significant impact to a thermal processing budget.

SUMMARY OF THE INVENTION

A method for fabricating a semiconductor device, in accordance with the present invention, includes the steps of providing a semiconductor wafer having exposed p-doped silicon regions and placing the wafer in an electrochemical cell such that a solution including electrolytes interacts with the exposed p-doped silicon regions to form an oxide on the exposed p-doped silicon regions when a potential difference is provided between the wafer and the solution.

In alternate methods, the step of applying a voltage between the wafer and the solution to create the potential difference such that the voltage applied controls the thickness of the oxide may be included. The solution preferably includes water, and the electrolyte preferably includes an ionic compound. The step of placing the wafer in an electrochemical cell may include the steps of placing the wafer in an electrochemical cell such that the wafer has an exposed surface area including the exposed p-doped silicon regions thereon and providing a counter electrode in the solution having a substantially same exposed surface area as the exposed surface area of the wafer. The step of placing the wafer in an electrochemical cell may include the step of sealing other than exposed areas of the wafer to prevent contact with the solution. The step of placing the wafer in an electrochemical cell may alternately include the step of placing the wafer in an electrochemical cell such that a front surface of the wafer including the exposed p-doped silicon regions is exposed to an oxidation chamber and a back surface of the wafer is exposed to a second solution which transfers a potential to the wafer to cause the potential difference. The solution including electrolytes preferably interacts with the p-doped silicon regions by reacting according to the reaction:

The reaction preferably occurs at about room temperature. A semiconductor device may be fabricated according to the above methods.

A method for electrochemically forming a trench collar includes the steps of forming a deep trench in a silicon substrate, the deep trench having sidewalls adjacent to a p-doped well formed in the substrate and a buried plate formed within the substrate surrounding a lower portion of the deep trench, placing the silicon substrate in an electrochemical cell, the electrochemical cell including a solution having electrolytes dissolved therein and applying a first potential to the silicon substrate and a second potential to the solution to form a potential difference therebetween such that a trench collar is electrochemically formed on the sidewalls of the deep trench adjacent to the p-doped well and selective to the buried plate.

Another method for electrochemically forming a trench collar includes the steps of forming a deep trench in a silicon substrate, the deep trench having sidewalls adjacent to a p-doped well formed in the substrate and a buried plate formed within the substrate surrounding a lower portion of the deep trench, placing the silicon substrate in an electrochemical cell, the electrochemical cell including an aqueous solution having electrolytes dissolved therein, applying a first potential to the silicon substrate and a second potential to the solution to form a potential difference therebetween, reacting the aqueous solution with the p-doped well formed in the substrate to form an electrochemically formed trench collar on the sidewalls of the deep trench adjacent to the p-doped well and selective to the buried plate and adjusting a thickness of the trench collar by adjusting the potential difference.

In alternate methods, the potential difference is preferably applied to control the thickness of the trench collar. The solution preferably includes water, and the electrolyte preferably includes an ionic compound. The step of placing the silicon substrate in an electrochemical cell may include the steps of placing the silicon substrate in an electrochemical cell such that the substrate has an exposed surface area including the sidewalls of the deep trench adjacent to the p-doped well and providing a counter electrode in the solution having a substantially same exposed surface area as the exposed surface area of the substrate. The step of placing the silicon substrate in an electrochemical cell may include the step of sealing other than exposed areas of the substrate to prevent contact with the solution. The step of placing the silicon substrate in an electrochemical cell may include the step of placing the silicon substrate in an electrochemical cell such that a front surface of the substrate including the sidewalls of the deep trench adjacent to the p-doped well is exposed to an oxidation chamber and a back surface of the wafer is exposed to a second solution which transfers the first potential to the substrate to cause the potential difference. The solution including electrolytes preferably interacts with the sidewalls of the deep trench adjacent to the p-doped well by reacting according to the reaction:

$$Si+H_2O \rightarrow SiO_2+4H^++4e^-.$$

The reaction preferably occurs at about room temperature. The method may include the step of annealing the trench collar to densify the trench collar. A semiconductor device may be fabricated according to the above methods.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention relates to semiconductor fabrication and more particularly to forming a low temperature, self-aligning trench collar. The present invention provides for a trench collar which is advantageously formed by employing an anodic oxidation of silicon in a conducting electrolyte according to an electrochemical reaction. Although described by way of example for trench collar formation, the present invention is much broader and is applicable to any electrochemical deposition for semiconductor devices.

The present invention forms a trench collar inside a deep trench by employing an electrochemical process. An illustrative electrochemical reaction may include:

$$Si+H_2O \rightarrow SiO_2+4H^++4e^- \tag{EQ. 1}$$

In a preferred embodiment, p-type doped silicon is employed since oxides do not readily grow on n-type doped silicon (dark silicon). In one embodiment, a reaction rate of EQ. 1 is controlled by an electric field (high field mechanism) within an oxide which forms the trench collar. In this way, a uniform thickness for the trench collar may be achieved. Trench collar thickness is controlled by an applied anodic voltage. Illustratively, a growth factor of about 1.5 nm per volt may be achieved. In this way, by setting the voltage a predetermined thickness is provided. For example, if 20 volts is applied a 30 nm thick film will be formed. The reaction of EQ. 1 is preferably carried out at room temperature, however other temperatures are contemplated which may be used to affect the reaction rate. In an alternate embodiment, an optional anneal process may be employed to densify the oxide formed. Preferably the anneal is a low temperature anneal between about 400 degrees C. to about 700 degrees C.

Figure 1:
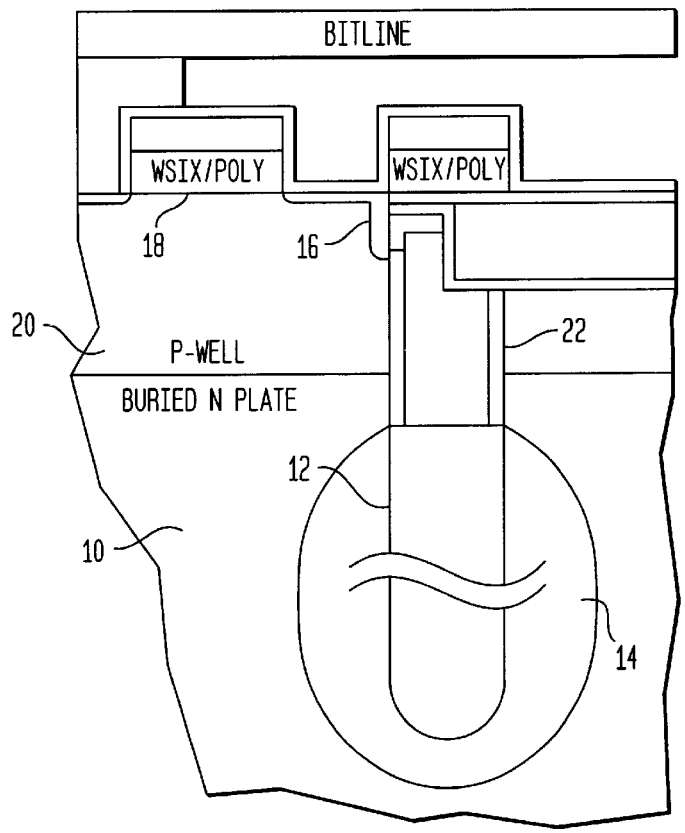
FIG. 1 is a cross-sectional view of a conventional memory cell.
Figure 2:
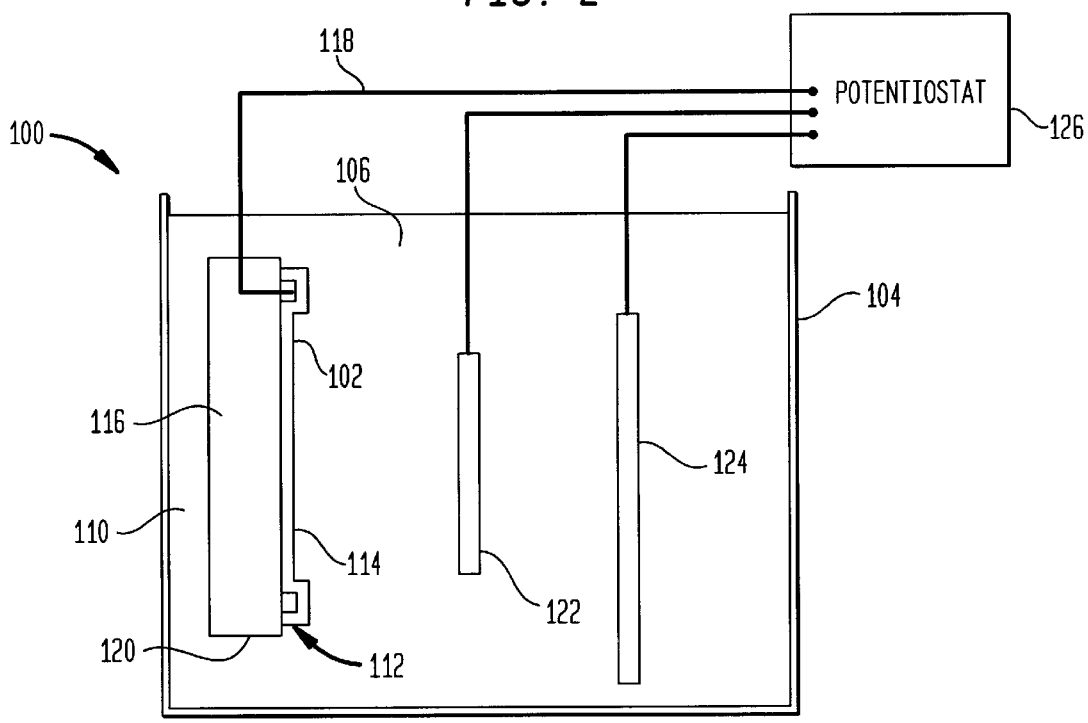
FIG. 2 is a schematic diagram of an apparatus for electrochemically forming an oxide in accordance with the present invention.

Referring now in specific detail to the drawings in which like reference numerals identify similar or identical elements throughout the several views, and initially to FIG. 2, an apparatus 100 is shown for applying a voltage for controlling electrochemical oxide formation on a substrate/wafer 102 (hereinafter wafer 102) in accordance with the present invention. Apparatus 100 is an electrochemical cell which includes a bath 104 which is filled with a liquid 106 including an electrolyte. Liquid 106 is preferably water and the electrolyte may include ionic compounds such as salts, acid compounds, base compounds, etc. or a combination thereof. In one embodiment, the electrolyte includes $H_2SO_4$ having a normality of between about 0.001 N and about 1 N. Other compounds and concentrations are contemplated and may be provided such that ions are capable of transfer between electrodes in bath 104.

Wafer 102 is secured to an isolating wafer holder 110. Clamps 112 are provided about a periphery of wafer 102 to both secure and seal wafer 102 such that only an upper face 114 of wafer 102 is exposed to liquid 106 in bath 104. Electrical contact is made to wafer 102 on a backside 116 through a conductive wire 118. A conductive film or foil 120 may be disposed between holder 110 and wafer 102 to improve electrical contact between wire 118 and wafer 102. A reference electrode 122 is include in bath 104 to maintain a predefined potential in liquid 106. A counter electrode 124 is also included. Counter electrode 124 preferably includes at least the same amount of exposed surface area as wafer 102. This provides more uniform thickness control by more symmetrically distributing ion flow in bath 104. A voltage source or potentiostat 126 is included for providing a voltage difference between wafer 102 and reference electrode 122. This voltage difference is used to control the thickness of oxide deposited on wafer 102 as described above. Advantageously, exposed p-doped silicon areas on wafer 102 react such that the oxide formation occurs only over the exposed p-doped silicon areas.

Figure 3:
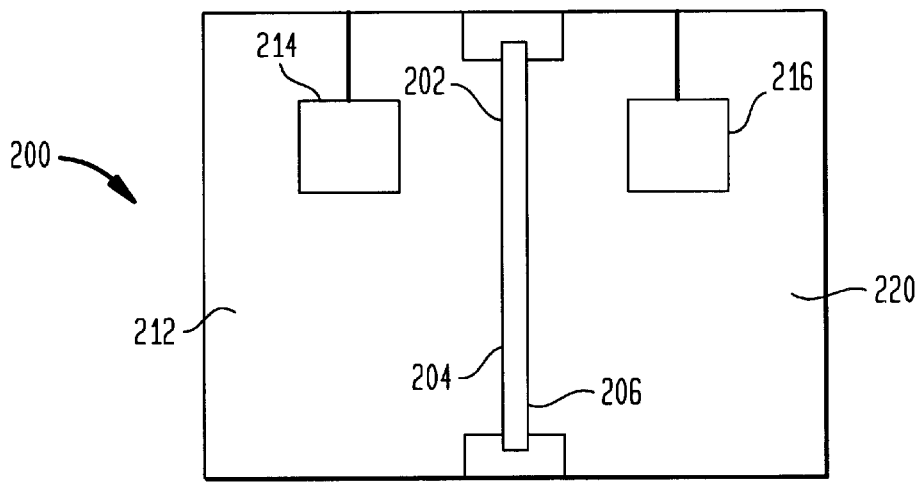
FIG. 3 is a schematic diagram of an alternate apparatus for electrochemically forming an oxide in accordance with the present invention.

Referring to FIG. 3, an alternate embodiment of the present invention includes apparatus 200 which also includes an electrochemical cell. A wafer 202 includes a front surface 204 and a back surface 206. Front surface 204 is exposed to an oxidation chamber 212 which includes an electrolyte in an aqueous solution, for example, $H_2SO_4$ in water, An inert electrode 214 is disposed in chamber 212 for providing a first potential to chamber 212 and therefore front surface 204 of wafer 202. Back surface 204 makes contact to a second electrode 216 through an electrolyte in an aqueous solution, for example, HF in water within a half cell or chamber 220. This provides an electrical contact to back surface 206 of wafer 202 and creates a second potential voltage to activate the reaction according to EQ. 1 above. Liquid in chamber 220 is sealed off from liquid in chamber 212.

As mentioned, the reaction of EQ. 1 only takes place on exposed p-type doped silicon (i.e., p-doped silicon substrate). In one embodiment, this permits for a self-aligned collar formation if differently doped trench portions are provided in a semiconductor device. In an illustrative example, a buried plate (n-type doping of silicon substrate) is formed in a lower portion of a trench while an upper portion of the trench is p-type doped (p-doping of silicon substrate). Consequently, the anodic trench collar may be formed after buried plate formation without the need of any additional process steps (liner, recesses, etc.) which are typical in the prior art. The trench collar will only grow on the p-doped region and is therefore self-aligned.

FIGS. 4–8 describe a conventional formation of deep trenches and buried plate formation needed as preparation for formation of a trench collar in accordance with the present invention.

Figure 4:
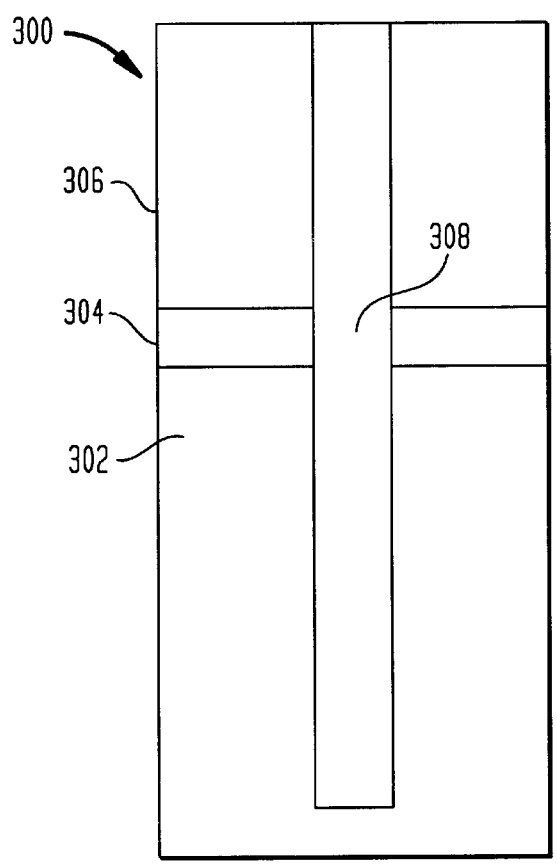
FIG. 4 is a cross-sectional view of a conventional memory cell showing a deep trench formed in a substrate.

Referring to FIG. 4, a semiconductor device 300 is shown for processing in accordance with the present invention. A substrate 302 is preferably formed from a p-doped monocrystalline silicon material. A pad stack 304 is formed on substrate 302. Pad stack 304 may include a nitride layer and an oxide layer. A hard mask layer 306 is deposited or spun on pad stack 304. Hard mask layer 306 is lithographically patterned to etch locations for trenches 308. Trenches 308 are etched into substrate 302 to form deep trench capacitors for DRAM memory device for example.

Figure 5:
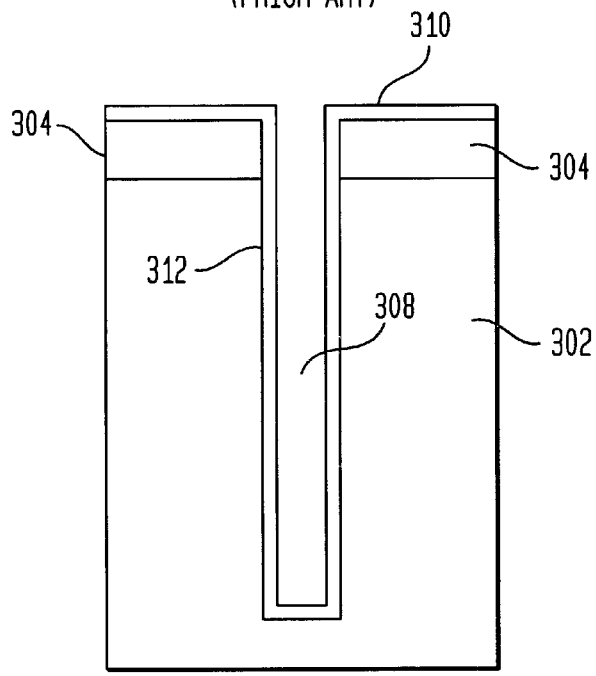
FIG. 5 is a cross-sectional view of the conventional memory cell of FIG. 4 showing the deep trench lined with a dopant rich material.

Referring to FIG. 5, a buried plate is formed by depositing a dopant rich material 310, preferably arsenic silicate glass (ASG) on sidewalls 312 of trench 308.

Figure 6:
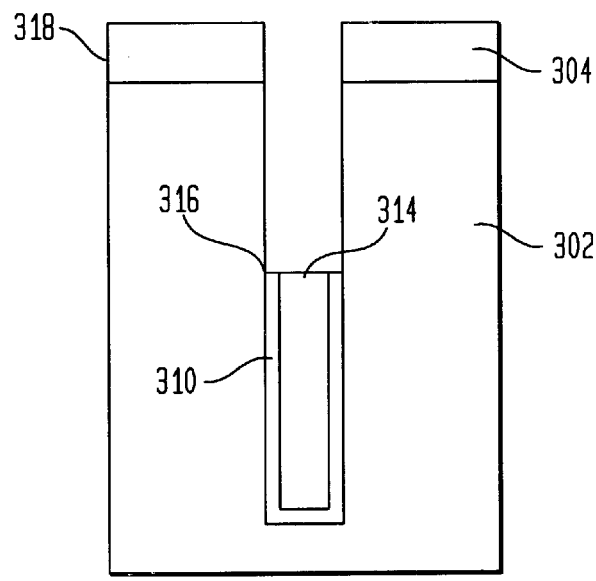
FIG. 6 is a cross-sectional view of the conventional memory cell of FIG. 5 showing the dopant rich material recessed for the formation of a buried strap.

Referring to FIG. 6, trench 308 is then filled with a resist material 314 and recessed to an upper edge 316 of a location where a buried plate is to be formed. This may be about 1–3 microns from a top surface 318 of substrate 302. Dopant rich material 310 is removed, preferably by a wet-etch process down to upper edge 316. Resist material 314 is then removed.

Figure 7:
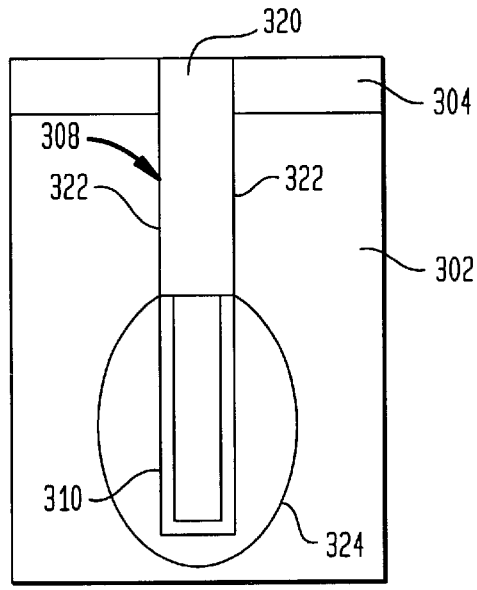
FIG. 7 is a cross-sectional view of the conventional memory cell of FIG. 6 showing the dopant rich material capped by TEOS to prevent outdiffusion to a p-doped of p-well region and further showing n-type dopants diffused into the substrate surrounding a lower portion of the trench.

Referring to FIG. 7, a TEOS cap 320 is formed in trench 308 to prevent out diffusion of dopants from dopant rich material 310 into a collar region 322. A high temperature drive-in process is performed to drive n-type dopants into substrate 302 to form a buried plate 324. Buried player 324 is formed using n-type dopants.

Figure 8:
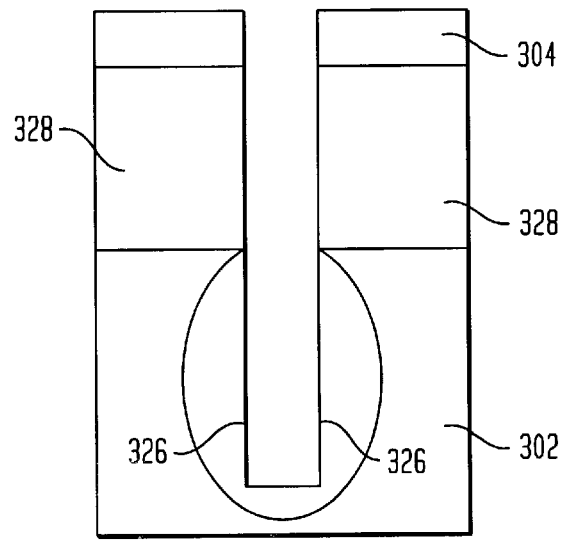
FIG. 8 is a cross-sectional view of the conventional memory cell of FIG. 7 showing the trench prepared for the present invention.

Referring to FIG. 8, TEOS cap 320 and remaining portions of dopant rich material 310 are removed, preferably by a wet etching process. This leaves a bare silicon surface having an n-type dopant portion 326 and a p-type dopant portion 328.

Figure 9:
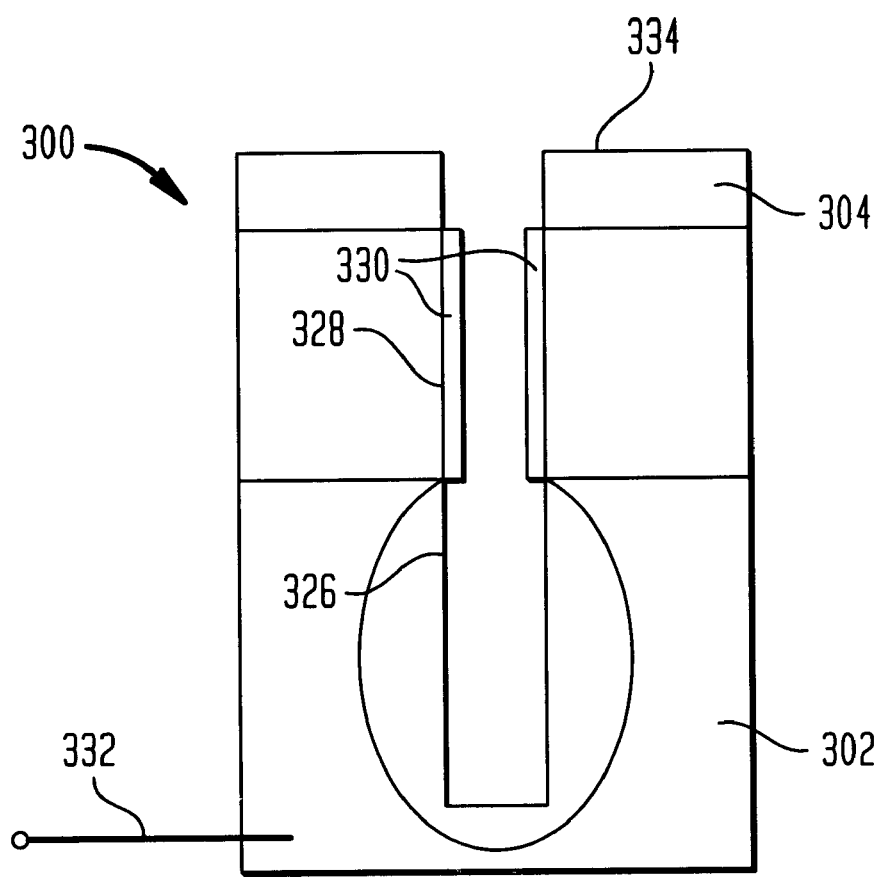
FIG. 9 is a cross-sectional view of the memory cell of FIG. 8 showing a trench collar formed in accordance with the present invention.

Referring to FIG. 9, in accordance with the present invention, a self-aligned anodic collar 330 is shown. As described above, an electrode 332 is connected to substrate 302 to provide a first potential thereto. A front surface 334 of semiconductor device 300 is exposed to electrolytes in aqueous solution 336. Electrolytes in solution are maintained at a second potential such that a potential difference is created between the first and second potentials. This potential difference is used to control the reaction of EQ. 1 such that a thickness of collar 330 is set and controlled in accordance with the invention. In a preferred embodiment, the thickness of collar 330 is between about 20 nm and 60 nm. This thickness is achieved by setting the potential difference to between about 13 volts to about 40 volts. Advantageously, the reaction from EQ. 1 occurs in p-type dopant portion 328 and not in n-type dopant portion 326 thereby forming collar 330 in a self aligned manner. Advantageously, the present invention may be performed at room temperature which save the thermal budget.

In other embodiments, an annealing process may be optionally performed to densify collar 330. For example, by heating in a temperature range of about between 400 degrees C. to 700 degrees C, a more dense collar 330 is formed. After collar 330 formation, processing proceeds as is known in the art.

The present invention provides many advantages over the prior art LOCOS collar formation. Some of these advantages include:

1. The process in accordance with the invention is self-aligned to the buried plate. This means a significant process simplification is achieved in comparison to the conventional processes which require an additional deep trench polysilicon fill and recess.

2. Low thermal budget. The present invention can be practiced at room temperature. Therefore, less stress is induced to trench/device interfaces resulting in improved VRT behavior.

3. Improved oxide thickness control since the thickness is directly given and self-limited by the applied anodic potential. Therefore, no subsequent separate thickness measurement is needed.

4. No nitride liner is needed to protect the lower portion of the trench when the collar is to be formed. This eliminates many processing steps as compared to conventional techniques.

5. Cheaper tools. The present invention needs less expensive electrochemical cells.

Additionally, a good collar oxide homogeneity is obtainable due to the present invention. This is an advantage with respect to the conventional high temperature LOCOS collar oxide which shows a significant dependence on oxide thickness to Si-crystal orientation. A more homogenous oxide thickness results in a more reliable oxide collar.

Having described preferred embodiments for a low temperature self-aligned collar formation (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for fabricating a semiconductor device comprising the steps of:

providing a semiconductor wafer having exposed p-doped silicon regions and exposed n-doped silicon regions; and placing the wafer in an electrochemical cell such that a solution including electrolytes interacts with the exposed p-doped silicon regions to form an oxide on the exposed p-doped silicon regions selective to the n-doped silicon regions when a potential difference is provided between the wafer and the solution, wherein the step of placing the wafer in an electrochemical cell further includes the steps of:

placing the wafer in an electrochemical cell such that the wafer has an exposed surface area including the exposed p-doped silicon regions thereon; and providing a counter electrode in the solution having a substantially same exposed surface area as the exposed surface area of the wafer.

2. The method as recited in claim 1, further comprising the step of applying a voltage between the wafer and the solution to create the potential difference such that the voltage applied controls the thickness of the oxide.

3. The method as recited in claim 1, wherein the solution includes water.

4. The method as recited in claim 1, wherein the electrolyte includes an ionic compound.

5. The method as recited in claim 1, wherein the step of placing the wafer in an electrochemical cell includes the step of sealing other than exposed areas of the wafer to prevent contact with the solution.

6. The method as recited in claim 1, wherein the step of placing the wafer in an electrochemical cell includes the step of placing the wafer in an electrochemical cell such that a front surface of the wafer including the exposed p-doped silicon regions is exposed to an oxidation chamber and a back surface of the wafer is exposed to a second solution which transfers a potential to the wafer to cause the potential difference.

7. The method as recited in claim 1, wherein the solution including electrolytes interacts with the p-doped silicon regions by:

reacting according to the reaction:

$$Si + H_2O \rightarrow SiO_2 + 4H^+ 4e^-$$ (EQ. 1).

8. The method as recited in claim 7, wherein the reaction occurs at about room temperature.

9. A method for electrochemically forming a trench collar comprising the steps of:

forming a deep trench in a silicon substrate, the deep trench having sidewalls adjacent to a p-doped well formed in the substrate and an n-type buried plate formed within the substrate surrounding a lower portion of the deep trench;

placing the silicon substrate in an electrochemical cell, the electrochemical cell including a solution having electrolytes dissolved therein; and applying a first potential to the silicon substrate and a second potential to the solution to form a potential difference therebetween such that a trench collar is electrochemically deposited on the sidewalls of the deep trench adjacent to the p-doped well and selective to the buried plate.

10. The method as recited in claim 9, wherein the potential difference is applied to control the thickness of the trench collar.

11. The method as recited in claim 9, wherein the solution includes water.

12. The method as recited in claim 9, wherein the electrolyte includes an ionic compound.

13. The method as recited in claim 9, wherein the step of placing the silicon substrate in an electrochemical cell includes the steps of:

placing the silicon substrate in an electrochemical cell such that the substrate has an exposed surface area including the sidewalls of the deep trench adjacent to the p-doped well; and providing a counter electrode in the solution having a substantially same exposed surface area as the exposed surface area of the substrate.

14. The method as recited in claim 13, wherein the step of placing the silicon substrate in an electrochemical cell includes the step of sealing other than exposed areas of the substrate to prevent contact with the solution.

15. The method as recited in claim 9, wherein the step of placing the silicon substrate in an electrochemical cell includes the step of placing the silicon substrate in an electrochemical cell such that a front surface of the substrate including the sidewalls of the deep trench adjacent to the p-doped well is exposed to an oxidation chamber and a back surface of the wafer is exposed to a second solution which transfers the first potential to the substrate to cause the potential difference.

16. The method as recited in claim 9, wherein the solution including electrolytes interacts with the sidewalls of the deep trench adjacent to the p-doped well by:

reacting according to the reaction:

$$Si + H_2O \rightarrow SiO_2 + 4H^+ 4e^-$$ (EQ. 1).

17. The method as recited in claim 16, wherein the reaction occurs at about room temperature.

18. The method as recited in claim 9, further comprising the step of annealing the trench collar to densify the trench collar.

19. A method for electrochemically forming a trench collar comprising the steps of:

forming a deep trench in a silicon substrate, the deep trench having sidewalls adjacent to a p-doped well formed in the substrate and an n-type buried plate formed within the substrate surrounding a lower portion of the deep trench;

placing the silicon substrate in an electrochemical cell, the electrochemical cell including an aqueous solution having electrolytes dissolved therein;

applying a first potential to the silicon substrate and a second potential to the solution to form a potential difference therebetween;

reacting the aqueous solution with the p-doped well formed in the substrate to form an electrochemically deposited trench collar on the sidewalls of the deep trench adjacent to the p-doped well and selective to the buried plate; and adjusting a thickness of the trench collar by adjusting the potential difference.

20. The method as recited in claim 19, wherein the aqueous solution including electrolytes interacts with the sidewalls of the deep trench adjacent to the p-doped well by:

reacting according to the reaction:

$$Si+H_2O \rightarrow SiO_2+4H^++4e^- \qquad (EQ.\ 1).$$

21. The method as recited in claim 20, wherein the reaction occurs at about room temperature.

22. The method as recited in claim 19, further comprising the step of annealing the trench collar to densify the trench collar.

* * * * *